United States Patent
Frank et al.

(10) Patent No.: US 9,355,836 B2
(45) Date of Patent: May 31, 2016

(54) METHOD AND APPARATUS FOR LIQUID TREATMENT OF WAFER SHAPED ARTICLES

(71) Applicant: LAM RESEARCH AG, Villach (AT)

(72) Inventors: Dieter Frank, Velden (AT); Michael Dalmer, Villach-Landskron (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 14/145,727

(22) Filed: Dec. 31, 2013

(65) Prior Publication Data

US 2015/0187561 A1 Jul. 2, 2015

(51) Int. Cl.
| | | |
|---|---|---|
| *H01L 21/31* | (2006.01) | |
| *H01L 21/02* | (2006.01) | |
| *B01D 53/22* | (2006.01) | |
| *B01D 19/00* | (2006.01) | |
| *H01L 21/67* | (2006.01) | |

(52) U.S. Cl.
CPC ...... *H01L 21/02052* (2013.01); *B01D 19/0031* (2013.01); *B01D 19/0036* (2013.01); *B01D 53/22* (2013.01); *H01L 21/6708* (2013.01); *H01L 21/67051* (2013.01)

(58) Field of Classification Search
CPC . H01L 21/0206; H01L 21/306; H01L 21/206; B01D 19/30021
USPC ............................. 438/781; 134/109, 110, 33
See application file for complete search history.

(56) References Cited

U.S. PATENT DOCUMENTS

| | | |
|---|---|---|
| 4,903,717 A | 2/1990 | Sumnitsch |
| 5,882,433 A | 3/1999 | Ueno |
| 7,947,112 B1 * | 5/2011 | Gerner et al. ............... 95/46 |
| 2008/0142054 A1 * | 6/2008 | Eitoku ....................... 134/30 |
| 2008/0297577 A1 * | 12/2008 | Wouters et al. ............ 347/89 |
| 2009/0255555 A1 * | 10/2009 | Gouk et al. ................. 134/1 |
| 2010/0320609 A1 * | 12/2010 | Mayer et al. ............. 257/773 |
| 2011/0240601 A1 * | 10/2011 | Hashizume et al. ........ 216/83 |
| 2012/0103371 A1 | 5/2012 | Yun et al. |

FOREIGN PATENT DOCUMENTS

WO    2011/007287    1/2011

* cited by examiner

*Primary Examiner* — Caridad Everhart
(74) *Attorney, Agent, or Firm* — Young & Thompson

(57) ABSTRACT

In an apparatus and method for treating a wafer-shaped article, a spin chuck is provided for holding and rotating a wafer-shaped article. A first liquid dispenser communicates with a supply of an organic liquid and is positioned so as to dispense the organic liquid onto a surface of a wafer-shaped article. A degasifying unit is positioned upstream of the first liquid dispenser and downstream of the supply. The degasifying unit is configured to reduce a dissolved gas content of the organic liquid to less than 20% of a saturation concentration at a pressure of 1 bar.

15 Claims, 4 Drawing Sheets

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for drying a surface of a disc-shaped article are typically used in the semiconductor industry after cleaning a silicon wafer during production processes (e.g. pre-photo clean, post CMP-cleaning, and post plasma cleaning). However, such drying methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Various drying methods are known in the semiconductor industry, some of which utilize isopropyl alcohol to reduce surface tension of rinse water on a semiconductor wafer surface. See, e.g., U.S. Pat. No. 5,882,433. Improvements upon such methods, involving the use of heated isopropyl alcohol, are described in commonly-owned patent applications WO 2011/007287 and U.S. Ser. No. 12/914,802 (filed Oct. 28, 2010).

There remains a need, however, to develop improved methods for preventing pattern collapse in the submicroscopic structures formed on such semiconductor wafers, not only during such drying process but also during other liquid treatments. Pattern collapse can occur when the surface tension of a liquid moving radially outwardly across the surface of a rotating wafer applies a damaging or destructive force to the submicroscopic structures formed on the wafer surface.

The problem of pattern collapse becomes more serious as the diameter of semiconductor wafers increases. For example, the current generation of single wafer wet processing technology is designed for 300 mm diameter wafers, but the previous generation technology was designed for 200 mm wafers and a next generation may be designed for wafers of 450 mm or larger diameter.

The problem of pattern collapse also becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

SUMMARY OF THE INVENTION

The present invention was based in part on the recognition by the present inventors that the problem of pattern collapse during hydrophobic drying processes with isopropyl alcohol is due partly to outgassing of air that is dissolved in the isopropyl alcohol, as well as the formation of silicates on the device structures owing to the oxygen concentration of the isopropyl alcohol.

Thus, in one aspect, the present invention relates to an apparatus for treating a wafer-shaped article, comprising a spin chuck for holding and rotating a wafer-shaped article. A first liquid dispenser communicates with a supply of an organic liquid and is positioned so as to dispense the organic liquid onto a surface of a wafer-shaped article when positioned on the spin chuck. A degasifying unit is positioned upstream of the first liquid dispenser and downstream of the supply, the degasifying unit being configured to reduce a dissolved gas content of the organic liquid to less than 20% of a saturation concentration at a pressure of 1 bar.

In preferred embodiments of the apparatus according to the present invention, the degasifying unit comprises a semipermeable membrane that is permeable to gas coming out of solution from the organic liquid, and impermeable to the organic liquid.

In preferred embodiments of the apparatus according to the present invention, the degasifying operates at a subatmospheric pressure less than 500 mbar (absolute pressure), preferably less than 200 mbar, and more preferably less than 100 mbar.

In preferred embodiments of the apparatus according to the present invention, the degasifying unit comprises one or a plurality of tubular semipermeable membranes, and wherein the degasifying unit is configured to generate a subatmospheric pressure of less than 500 mbar inside the one or plurality of semipermeable membranes.

In preferred embodiments of the apparatus according to the present invention, the organic liquid is 2-propanol.

In preferred embodiments of the apparatus according to the present invention, a second liquid dispenser communicates with a supply of a second liquid, wherein the second liquid contains more than 90 wt.-% water (i.e. a diluted aqueous solution or water, e.g. deionized water).

In preferred embodiments of the apparatus according to the present invention, the first and second liquid dispensers are each configured to dispense liquid from a central region of a wafer-shaped article toward a peripheral region of a wafer-shaped article, thereby to directly displace the second liquid with the organic liquid.

In preferred embodiments of the apparatus according to the present invention, the degasifying unit is configured to reduce a dissolved gas content of the organic liquid to less than 10% of a saturation concentration, and more preferably to less than 5% of a saturation concentration.

In another aspect, the present invention relates to a method for treating a wafer-shaped article, comprising positioning and rotating a wafer-shaped article on a spin chuck, degasifying an organic liquid to reduce a dissolved gas content of the organic liquid to less than 20% of a saturation concentration at a pressure of 1 bar, and to produce a degasified organic liquid, and dispensing the degasified organic liquid onto a surface of the wafer-shaped article rotating on the spin chuck.

In preferred embodiments of the method according to the present invention, the degasifying comprises contacting the organic liquid with a semipermeable membrane that is permeable to gas coming out of solution from the organic liquid, and impermeable to the organic liquid.

In preferred embodiments of the method according to the present invention, the degasifying comprises subjecting the organic liquid to a subatmospheric pressure less than 500 mbar, preferably less than 200 mbar, and more preferably less than 100 mbar.

In preferred embodiments of the method according to the present invention, the degasifying comprises contacting the organic liquid with one or a plurality of tubular semipermeable membranes, while maintaining a subatmospheric pressure of less than 500 mbar inside the one or plurality of semipermeable membranes.

In preferred embodiments of the method according to the present invention, the organic liquid is 2-propanol.

In preferred embodiments of the method according to the present invention, a second liquid is dispensed onto the surface of the wafer-shaped article adjacent to the organic liquid, wherein the second liquid contains more than 90 wt.-% water, thereby to directly displace the second liquid with the organic liquid.

In preferred embodiments of the method according to the present invention, 2-propanol and deionized water are dispensed from a central region of the wafer-shaped article toward a peripheral region of the wafer-shaped article.

In preferred embodiments of the method according to the present invention, the degasifying is performed so as to reduce a dissolved gas content of the organic liquid to less than 10% of a saturation concentration at a pressure of 1 bar, and more preferably to less than 5% of a saturation concentration at a pressure of 1 bar.

In preferred embodiments of the method according to the present invention, deionized water is dispensed simultaneously with the organic liquid onto a same surface of the wafer-shaped article, and the degasifying is performed so as to prevent formation of bubbles at an interface between the organic liquid and the water.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
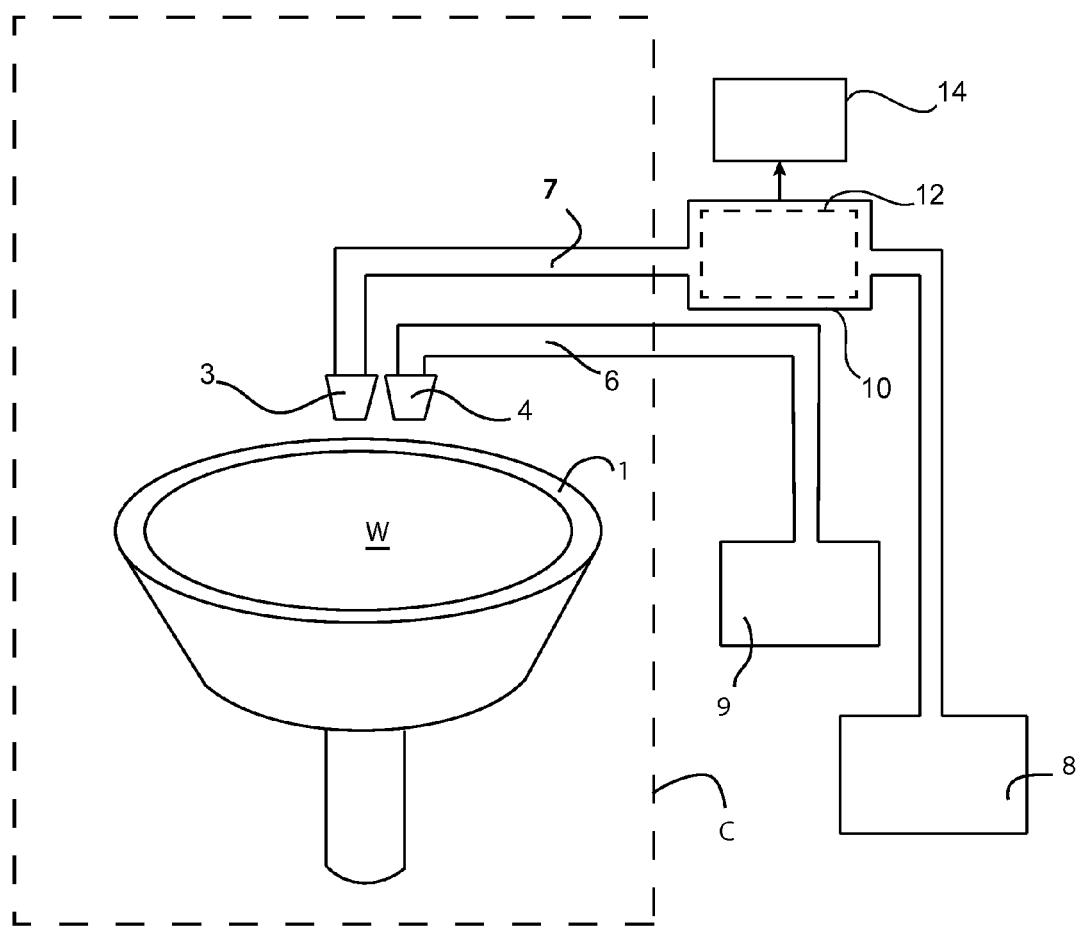
FIG. 1 is a schematic view of an apparatus according to a first embodiment of the invention.

Referring now to the drawings, FIG. 1 depicts a spin chuck 1 that holds a wafer W thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717.

Chuck 1 is typically present in a process module for single wafer wet processing of semiconductor wafers, and may or may not be positioned within a chamber C. Two liquid dispensers are positioned above the chuck 1, namely, an IPA dispense nozzle 3 for dispensing isopropanol, and a DIW dispense nozzle 4 for dispensing deionized water onto the upper surface of wafer W.

IPA dispense nozzle 3 receives isopropanol from IPA reservoir 8 via IPA supply conduit 7, whereas DIW dispense nozzle 4 receives deionized water from DIW reservoir 9 via DIW supply conduit 6.

In this embodiment, the isopropanol from IPA reservoir 8 is passed through a degasifying unit 10 prior to being fed to the IPA dispense nozzle 3. The degasifying unit 10 includes a semipermeable membrane 12, and a vacuum pump 14 is connected to this degasifying unit at vacuum connections 16 (see FIG. 2) to assist in bringing dissolved oxygen in the IPA out of solution and into gaseous form, to be separated from the IPA before the IPA is dispensed onto wafer W.

Figure 2:
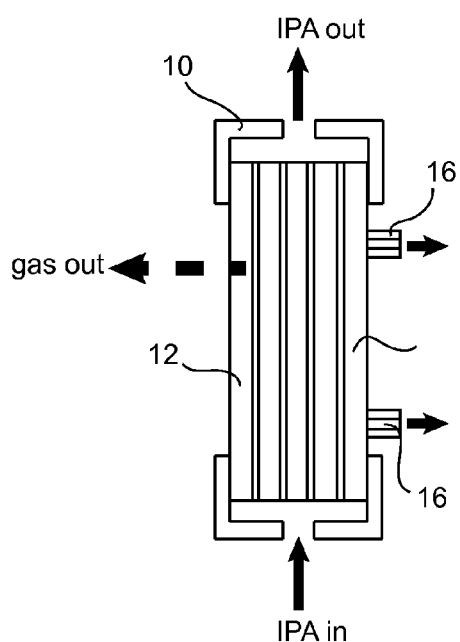
FIG. 2 is schematic view of the degasifying unit used in the apparatus of FIG. 1.

As shown in FIG. 2, the semipermeable membrane 12 is preferably a gas-permeable membrane tube, which can degasify the IPA based on a pressure differential between the inside and outside of the tube. Typically, a vacuum less than 500 mbar (absolute) is needed to degasify the IPA.

Figure 3A:
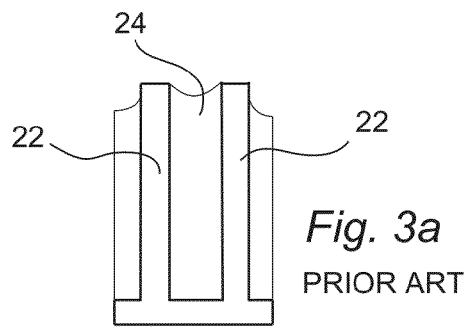
FIGS. 3a, 3b, 3c and 3d illustrate a sequence of silicate formation and pattern collapse that can occur with conventional drying techniques.
Figure 3B:
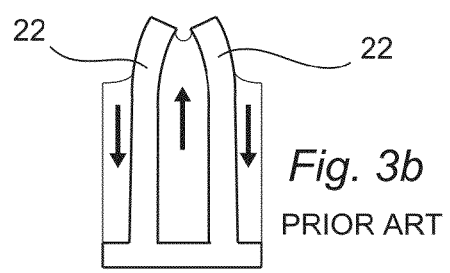
Figure 3C:
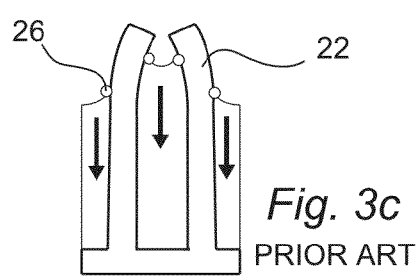
Figure 3D:
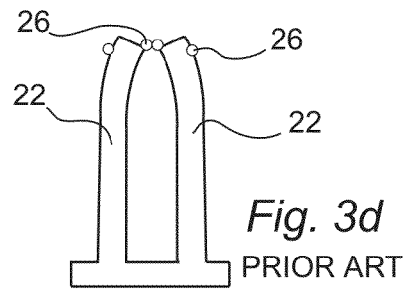

In FIG. 3a, non-degassed IPA 24 is shown between a pair of adjacent device features 22 formed on a semiconductor wafer that is undergoing treatment. As the features 22 begin to dry, the resultant forces displace the features toward one another, as shown in FIG. 3b. As drying continues, silicates begin to precipitate on the device features 22, the silicate precipitates being designated 26 in FIG. 3c. Finally, as the drying becomes complete, the precipitated silicates may aggregate with one another as shown in FIG. 3d, causing further distortion and collapse of device features 22, and adversely affecting the performance of the device.

Figure 4A:
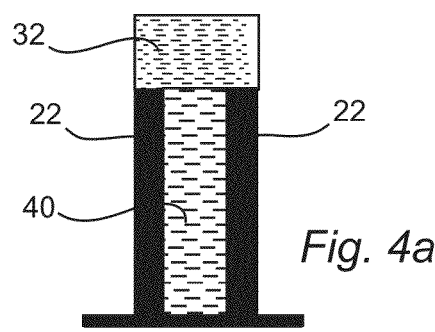
FIGS. 4a, 4b, 4c and 4d illustrate interface conditions between isopropyl alcohol and deionized water in conventional drying processes and according to embodiments of the present invention.

In FIG. 4a, device features 22 are again shown in the context of a drying process, wherein deionized water 40 has first been used to rinse the wafer, and isopropanol is then dispensed in order to displace the remaining deionized water from the wafer surface.

Figure 4B:
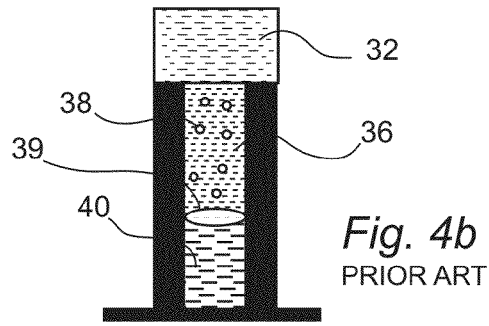

In conventional processes of this type, the present inventors have discovered that the oxygen dissolved in the IPA tends to come out of solution as bubbles 38 (see FIG. 4b), in a region 36 proximate the water 40, owing to the lower solubility of oxygen in water as compared to IPA. Indeed, a larger bubble 39 may form at the interface of the IPA and DIW, which blocks contact between the two liquids altogether.

Typical hydrophobic drying processes are based on hydrophobization of a substrate (wafer) by treatment with diluted HF followed by rinse with DI water and IPA. With the ever decreasing size of the device features on the wafer more and more pattern damage or leaning is observed. One mechanism for this effect is the formation of silicates and adhesion between device features caused by dissolved oxygen and/or remaining water, as discussed above in connection with FIGS. 3a-3d. Another mechanism would be the formation of gas bubbles caused by the different gas dissolving behavior of IPA and water, as discussed above in connection with FIGS. 4a-4d. IPA can dissolve more oxygen than water, and the disparity in oxygen solubility in these solvents increases with increasing temperature. Thus, when the dissolved oxygen in the IPA starts to outgas in the device features, this also causes the leaning.

Figure 4C:
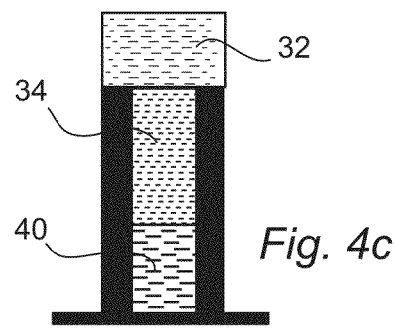
Figure 4D:
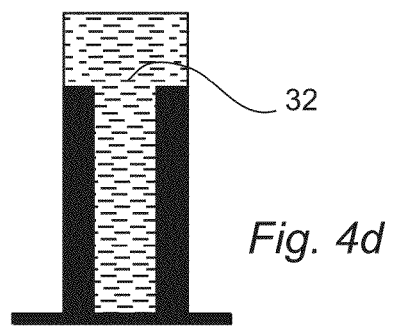

However, when the IPA is first degassed according to the methods and apparatus of the present invention, the foregoing problems are averted. That is, bubble formation is suppressed, as is the precipitation of silicates, owing to the reduced concentration of oxygen. Thus, as shown in FIG. 4c, the IPA 32 and DIW 40 are free to blend homogeneously in an intermediate region 34, such that the water 40 can be readily displaced and replaced by IPA 32, as shown in FIG. 4d.

Figure 5:
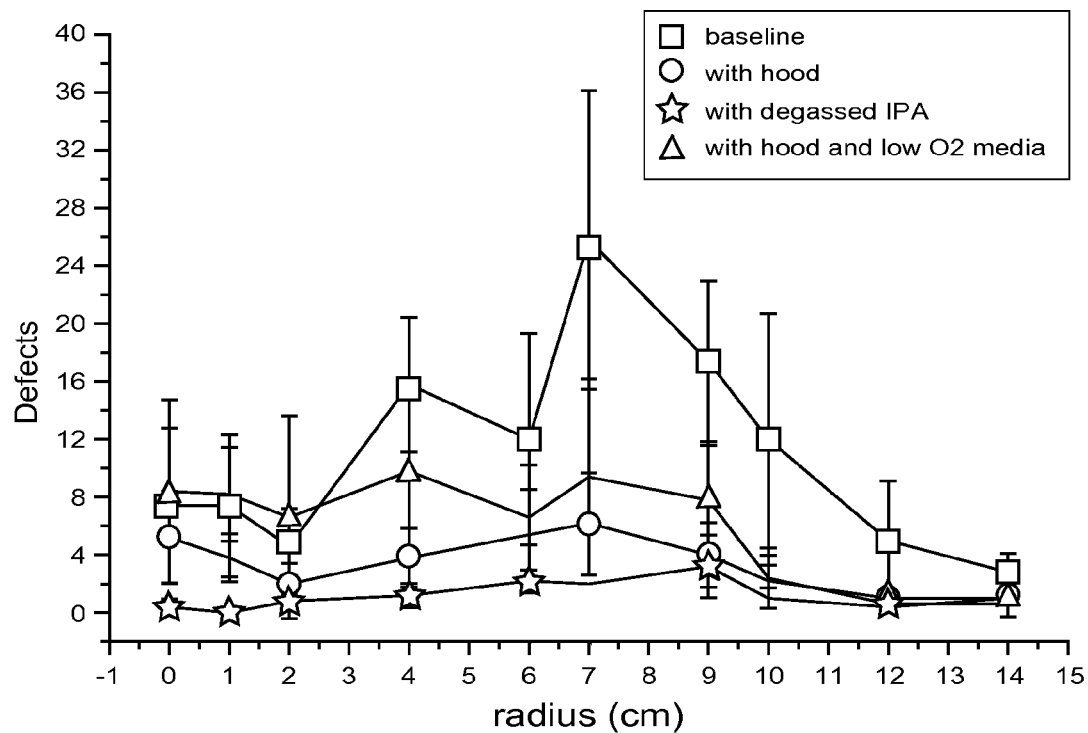
FIG. 5 presents data showing the influence of various drying techniques on pattern collapse.

FIG. 5 shows the effect of preferred embodiments of the present invention in relation to conventional techniques, by counting defects across the radius of 300 mm semiconductor wafers. The baseline data reflects non-degassed IPA and DIW. The hood data uses the same drying media in a nitrogen hood to provide a non-oxidizing ambient. The degassed IPA data reflects the techniques of the present invention, and the hood+low O2 media data used a nitrogen hood as well as degassed IPA.

The use of degassed IPA resulted in a very substantial decrease in defects relative to conventional techniques, which was most pronounced about halfway between the center and the outer periphery of the wafer. Degassed IPA in a nitrogen hood showed somewhat less improvement than degassed IPA without a nitrogen hood, which suggests that nitrogen bubbles might have interfered with drying.

Figure 6:
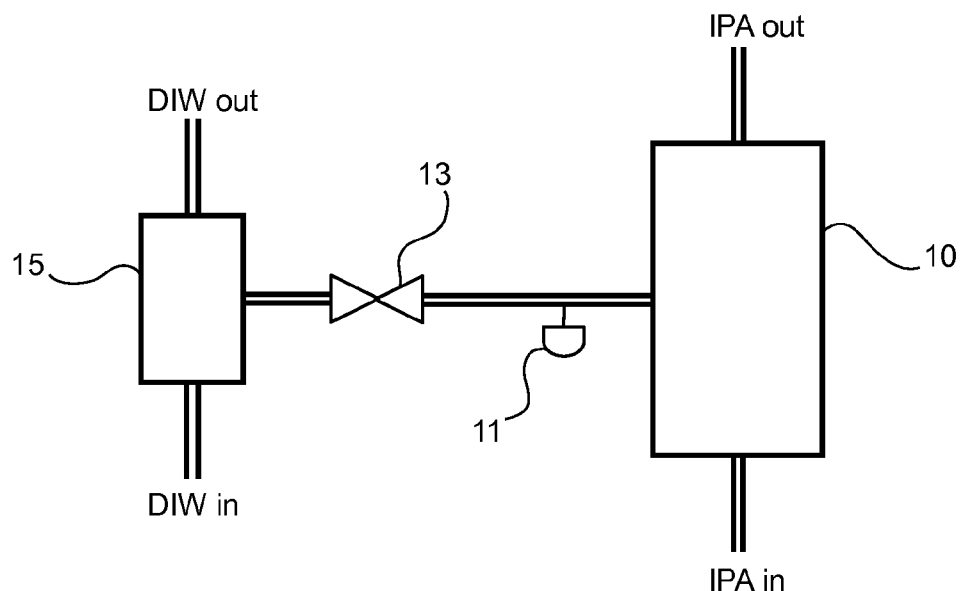
FIG. 6 schematically illustrates a possible supply configuration for deionized water and isopropanol.

In FIG. 6, a possible configuration of DIW and IPA supply is shown, wherein the DIW passes through venture 15, and wherein the venture 15 is connected to the degasifying unit 10 by a line that include check valve 13 and vacuum sensor 11.

Figure 7:
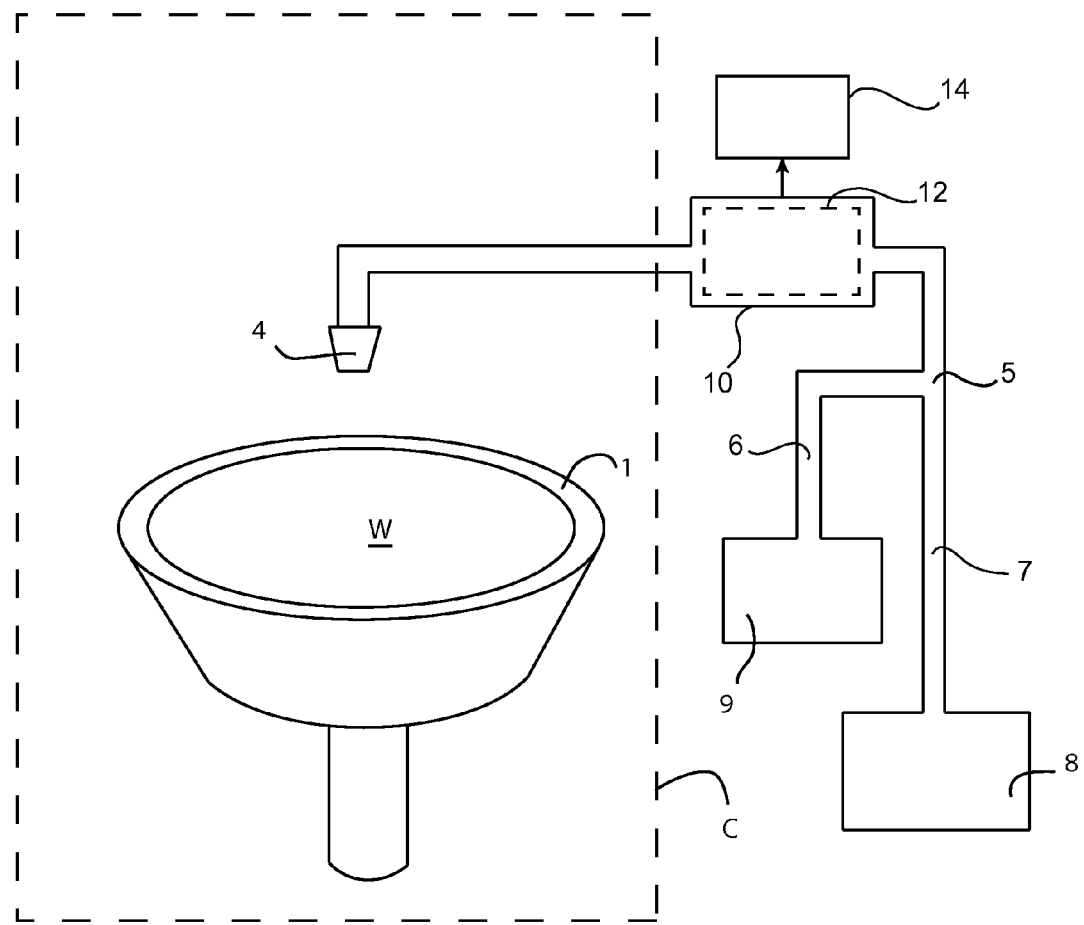
FIG. 7 is a schematic view of an apparatus according to a further embodiment of the invention.

In the alternative embodiment of FIG. 7, a single liquid dispense nozzle 4 is provided, and DIW from DIW reservoir 9 supplied through conduit 6 and IPA from IPA reservoir 8 supplied through conduit 7 are premixed at mixing junction 5, whereafter the mixture of DIW and IPA is passed through the degasifying unit 10 as described in connection with the preceding embodiments.

Reference to DIW and IPA in the preceding embodiments in by way of example only, as the methods and apparatus of the invention may be employed with any suitable pair of liquids, whether dispensed individually or in admixture. Advantageously, one liquid is an organic liquid and the other is aqueous, the aqueous liquid preferably being at least 90% by weight water, such as pure deionized water or mixtures of water and other liquids miscible therewith.

While the present invention has been described in connection with various preferred embodiments thereof, it is to be understood that those embodiments are provided solely to illustrate the invention, and should not be used as a pretext to limit the scope of protection conferred by the true scope and spirit of the appended claims.

What is claimed is:

1. Apparatus for treating a wafer-shaped article, comprising:
    a spin chuck for holding and rotating a wafer-shaped article;
    a first liquid dispenser communicating with a supply of an organic liquid and positioned so as to dispense the organic liquid in liquid form onto a surface of a wafer-shaped article when positioned on the spin chuck;
    a degasifying unit positioned upstream of said first liquid dispenser and downstream of said supply, said degasifying unit being configured to reduce a dissolved gas content of the organic liquid to less than 20% of a saturation concentration at a pressure of 1 bar; and
    a second liquid dispenser communicating with a supply of a second liquid, wherein the second liquid contains more than 90 wt.-% water.

2. The apparatus according to claim 1, wherein said degasifying unit comprises a semipermeable membrane that is permeable to gas coming out of solution from the organic liquid, and impermeable to the organic liquid.

3. The apparatus according to claim 1, wherein said degasifying operates at a subatmospheric pressure less than 500 mbar (absolute pressure), preferably less than 200 mbar, and more preferably less than 100 mbar.

4. The apparatus according to claim 1, wherein said degasifying unit comprises one or a plurality of tubular semipermeable membranes, and wherein said degasifying unit is configured to generate a subatmospheric pressure of less than 500 mbar inside the one or plurality of semipermeable membranes.

5. The apparatus according to claim 1, wherein the organic liquid is 2-propanol.

6. The apparatus according to claim 1, wherein said first and second liquid dispensers are each configured to dispense liquid from a central region of a wafer-shaped article toward a peripheral region of a wafer-shaped article, thereby to directly displace the second liquid with the organic liquid.

7. The apparatus according to claim 1, wherein said degasifying unit is configured to reduce a dissolved gas content of the organic liquid to less than 10% of a saturation concentration, and more preferably to less than 5% of a saturation concentration.

8. Method for treating a wafer-shaped article, comprising:
    positioning and rotating a wafer-shaped article on a spin chuck;
    degasifying an organic liquid to reduce a dissolved gas content of the organic liquid to less than 20% of a saturation concentration at a pressure of 1 bar, and to produce a degasified organic liquid;
    dispensing the degasified organic liquid in liquid form onto a surface of the wafer-shaped article rotating on the spin chuck; and
    dispensing a second liquid, wherein the second liquid contains more than 90 wt.-% water, onto the surface of the wafer-shaped article adjacent to the organic liquid, thereby to directly displace the second liquid with the organic liquid.

9. The method according to claim 8, wherein said degasifying comprises contacting the organic liquid with a semipermeable membrane that is permeable to gas coming out of solution from the organic liquid, and impermeable to the organic liquid.

10. The method according to claim 8, wherein said degasifying comprises subjecting the organic liquid to a subatmospheric pressure less than 500 mbar, preferably less than 200 mbar, and more preferably less than 100 mbar.

11. The method according to claim 8, wherein said degasifying comprises contacting the organic liquid with one or a plurality of tubular semipermeable membranes, while maintaining a subatmospheric pressure of less than 500 mbar inside the one or plurality of semipermeable membranes.

12. The method according to claim 8, wherein the organic liquid is 2-propanol.

13. The method according to claim 8, wherein 2-propanol and deionized water are dispensed from a central region of the wafer-shaped article toward a peripheral region of the wafer-shaped article.

14. The method according to claim 8, wherein said degasifying is performed so as to reduce a dissolved gas content of the organic liquid to less than 10% of a saturation concentration at a pressure of 1 bar, and more preferably to less than 5% of a saturation concentration at a pressure of 1 bar.

15. The method according to claim 8, wherein the second liquid is deionized water that is dispensed simultaneously with the organic liquid onto a same surface of the wafer-shaped article, and wherein said degasifying is performed so as to prevent formation of bubbles at an interface between the organic liquid and the water.

* * * * *